(12) United States Patent
Deweerd

(10) Patent No.: US 8,475,977 B2
(45) Date of Patent: Jul. 2, 2013

(54) PROTECTIVE CAP FOR EXTREME ULTRAVIOLET LITHOGRAPHY MASKS

(75) Inventor: Wim Yves Deweerd, San Jose, CA (US)

(73) Assignee: Intermolecular, Inc, San Jose, CA (US)

( * ) Notice: Subject to any disclaimer, the term of this patent is extended or adjusted under 35 U.S.C. 154(b) by 215 days.

(21) Appl. No.: 12/959,274

(22) Filed: Dec. 2, 2010

(65) Prior Publication Data
US 2012/0141923 A1 Jun. 7, 2012

(51) Int. Cl.
*G03F 1/22* (2012.01)
*G03F 1/24* (2012.01)

(52) U.S. Cl.
USPC .......................................................... 430/5

(58) Field of Classification Search
USPC ................................................. 430/5; 378/35
See application file for complete search history.

(56) References Cited

U.S. PATENT DOCUMENTS

| | | | |
|---|---|---|---|
| 5,928,817 A * | 7/1999 | Yan et al. | 430/5 |
| 6,555,297 B1 * | 4/2003 | Lercel | 430/313 |
| 7,078,134 B2 * | 7/2006 | Wurm et al. | 430/5 |

* cited by examiner

*Primary Examiner* — Stephen Rosasco

(57) ABSTRACT

An extreme ultraviolet (EUV) lithography mask is provided. The EUV lithography mask includes a reflective layer and an absorptive layer deposited over the reflective layer. The absorptive layer is patterned so as to define absorptive regions of the mask for absorbing EUV radiation and reflective regions of the mask for reflecting EUV radiation. The EUV lithography mask further includes a protective capping layer which is deposited over both the absorptive regions and the reflective regions of the mask.

18 Claims, 4 Drawing Sheets

PROTECTIVE CAP FOR EXTREME ULTRAVIOLET LITHOGRAPHY MASKS

RELATED APPLICATIONS

This application is related to U.S. application Ser. No. 12/959,265 filed on the same day as the present application and entitled "METHOD AND APPARATUS FOR EUV MASK HAVING DIFFUSION BARRIER."

BACKGROUND

Extreme ultraviolet (EUV) lithography is a next-generation optical lithography technology for the sub-22 nanometer (nm) semiconductor technology node. In contrast to conventional optical lithography utilized in current generation semiconductor manufacturing processes, such as DUV or ArF ("193 nm") optical lithography, EUV lithography utilizes a reflective mask which selectively reflects and absorbs extreme ultraviolet radiation. EUV radiation having a wavelength of approximately 10-20 nanometers is typically utilized.

Because of the extremely small printed feature sizes inherent in EUV lithography technology, it is important to maintain the EUV lithography mask to be as free of defects and contaminants as possible, as even very small defects and contaminants present in the EUV lithography mask may result in significant feature defects on the substrate in turn affecting the finished product's yield. In developing methods of cleaning EUV lithography masks, several challenges are faced.

The method of cleaning must be gentle enough so as not to damage the mask features, yet still provide for effective particle and contamination removal from the mask. Selectivity issues must be dealt with in the development of cleaning chemistries due to the different absorptive and reflective surfaces present on the mask. Furthermore, many current cleaning methods involve the use of high temperatures to increase the efficiency of the wet cleaning chemistry. However, repeated exposure of the EUV lithography mask to high temperatures can cause thermally-induced defects, such as defects in the reflective portions of the mask due to diffusion of materials between layers. Such internal defects cannot be removed, and may therefore diminish the lifetime of the EUV lithography mask.

FIG. 1 illustrates a graph showing number of defects in substrates produced from a given EUV lithography mask versus the number of use cycles for the mask. At an initial use cycle count C0 the EUV lithography mask produces substrates which are substantially defect deficient, having a defect level D0. As the number of use cycles increases, the level of defects produced by the EUV lithography mask rises until reaching a maximum tolerated defect level Dmax. When the level of defects produced by the EUV lithography mask reaches Dmax, the mask is then cleaned. The level of defects reaches Dmax at a use cycle count C1, at which point the EUV lithography mask is cleaned. This cleaning of the EUV lithography mask significantly improves the defect level of the mask, bringing the level of defects produced by the mask down to a level D1.

However, the level D1 is not as low as D0, thus indicating that it is not possible to clean the EUV lithography mask to the same level as originally possible upon initial use of the mask at use cycle count C0. This may be the result of several factors, such as a buildup of non-removable surface defects, such as defects within the layered structure of the EUV lithography mask. Or it may not be possible to fully clean particles and chemicals from the EUV lithography mask without damaging or otherwise compromising the EUV lithography mask in other ways. This may be due to selectivity issues and limitations due to the fragility of the patterned structure of the absorber layer of the EUV lithography mask.

Because the EUV lithography mask is not cleaned to the same level as before, fewer use cycles are enabled before the defect level produced by the mask once again reaches Dmax, and requires another cleaning. This is shown at use cycle C2, wherein the defect level produced by the mask has reached Dmax again, so as to require another cleaning. The number of use cycles from C1 to C2 is less than the number of use cycles from C0 to C1 because the defect level produced by the mask at C1 is greater than that at C0, as it was not possible to clean the EUV lithography mask at use cycle C1 to the defect level D0 of use cycle C0, but only to the defect level D1.

Similarly, at use cycle C2, the EUV lithography mask can only be cleaned to a defect level D2, which is greater than the defect level D1, which is the defect level to which the EUV lithography mask was cleaned at use cycle C1. A subsequent buildup of defects to the defect level Dmax occurs in fewer use cycles than the preceding buildup to the same level. As shown, the number of use cycles from C2 to C3 is less than that from C1 to C2, indicating that fewer use cycles were required to reach a defect level of Dmax again. Alternatively, a mask may be cleaned successfully over several iteration and then fail catastrophically upon one given clean due to pitting in one of the layers and go from D1 immediately to above Dmax.

As can be seen, the inability to adequately clean the EUV lithography mask results in an accumulating number of defects produced by the mask over time, which in turn shortens the time between cleans in successive cycles of operation in order to not compromise yield. As the time between cleans is shortened, the EUV lithography mask is potentially exposed to high temperatures more frequently, which results in further increases in diffusion-related defects within the EUV lithography mask. All of this causes a reduction in the useful lifetime of the EUV lithography mask before it is required to be replaced.

It is in this context that embodiments of the invention arise.

SUMMARY

Embodiments of the present invention provide an extreme ultraviolet lithography mask having a protective capping layer. Several inventive embodiments of the present invention are described below.

In one aspect of the invention, an extreme ultraviolet (EUV) lithography mask is provided. The EUV lithography mask includes a reflective layer, i.e., Bragg minor, and an absorptive layer deposited over the reflective layer. The absorptive layer is patterned so as to define absorptive regions of the mask for absorbing EUV radiation and reflective regions of the mask for reflecting EUV radiation. The EUV lithography mask further includes a protective capping layer which is conformally deposited over both the absorptive regions and the reflective regions of the mask.

In one embodiment of the EUV lithography mask, the protective capping layer is a continuous and homogeneous layer. In one embodiment, the protective capping layer has a thickness of less than about two nanometers. In one embodiment, the protective capping layer is substantially transparent to radiation having a wavelength of about 10 to 20 nanometers. In one embodiment of the EUV lithography mask, the protective capping layer includes a material selected from the following: $SiO_2$, SiN, SiC, SiB, $GeO_2$, TiO2, $HfO_2$, $ZrO_2$, Al$_2$O$_3$, and mixtures thereof. It should be appreciated that the list of materials is exemplary and not meant to be limiting.

In another embodiment, an EUV lithography mask is provided. The EUV lithography mask includes a top portion having absorptive regions for absorbing EUV radiation and reflective regions for reflecting EUV radiation. A transparent passivation layer is deposited over the top portion, the transparent passivation layer protects the absorptive regions and the reflective regions of the top portion. The EUV lithography mask further includes a bottom portion including a reflective layer for reflecting EUV radiation. In one embodiment of the EUV lithography mask, the transparent passivation layer has a thickness of less than about one nanometer and includes of a material selected from the following: SiO$_2$, SiN, SiC, SiB, GeO$_2$, TiO2, HfO$_2$, ZrO$_2$, Al$_2$O$_3$, mixtures thereof. In one embodiment, the transparent passivation layer is substantially transparent to radiation having a wavelength of about 10 to 20 nanometers.

In another embodiment of the invention, a method is provided for evaluating materials, unit processes, and process sequences for manufacturing an EUV lithography mask. According to the method, processing is performed for a first substrate having a first layer of material deposited over a second layer of material, the first and second layers representing a top portion of the EUV lithography mask. The first substrate is tested for adherence properties between the layers. Then processing is performed for regions on a second substrate in a combinatorial manner by varying one of materials, unit processes or process sequences based on results from the testing of the first substrate, the regions on the second substrate representing a barrier layer deposited over the top portion of the EUV lithography mask. The processed regions on the second substrate are tested for optical properties.

Other aspects of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings. Like reference numerals designate like structural elements.

DETAILED DESCRIPTION

The embodiments described herein provide a method and system for providing a protective capping layer deposited on an EUV lithography mask. It will be obvious, however, to one skilled in the art, that the present invention may be practiced without some or all of these specific details. In other instances, well known process operations have not been described in detail in order not to unnecessarily obscure the present invention.

EUV lithography, which is based upon exposure with the portion of the electromagnetic spectrum having a wavelength of 10-20 nanometers, may be used to print features with smaller critical dimension (CD) than other more conventional techniques, such as those utilizing deep ultraviolet (DUV) radiation. The embodiments described herein provide for an EUV lithography mask having a protective capping layer deposited as the outermost layer of the mask. The protective capping layer is deposited over and thereby protects underlying layers of the mask, such as an absorber layer, buffer layer, and/or capping layer. The protective capping layer is uniform and conformal to the surface of the EUV lithography mask, providing increased durability and enabling more aggressive cleaning or alternative cleaning methods to be applied the mask. The protective capping layer may thereby increase the lifetime utility of the EUV lithography mask.

Figure 1:
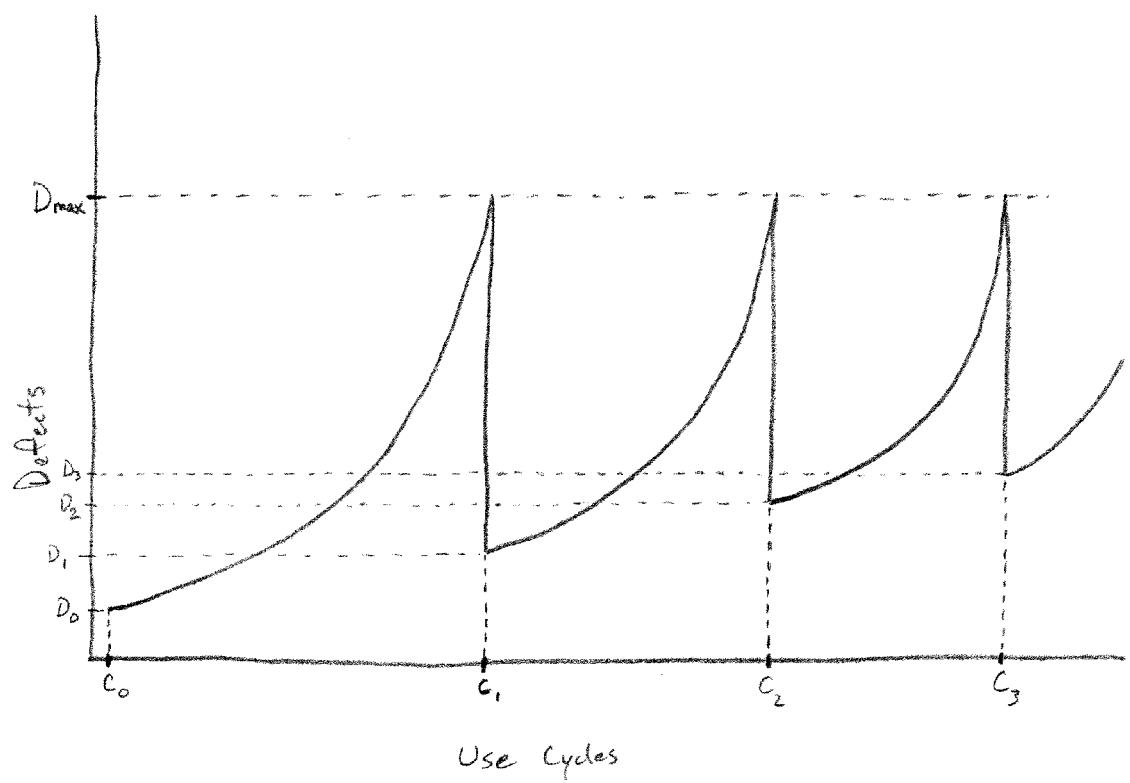
FIG. 1 illustrates a graph showing number of defects in substrates produced from a given EUV lithography mask versus the number of use cycles for the mask between cleaning cycles of the mask.
Figure 2:
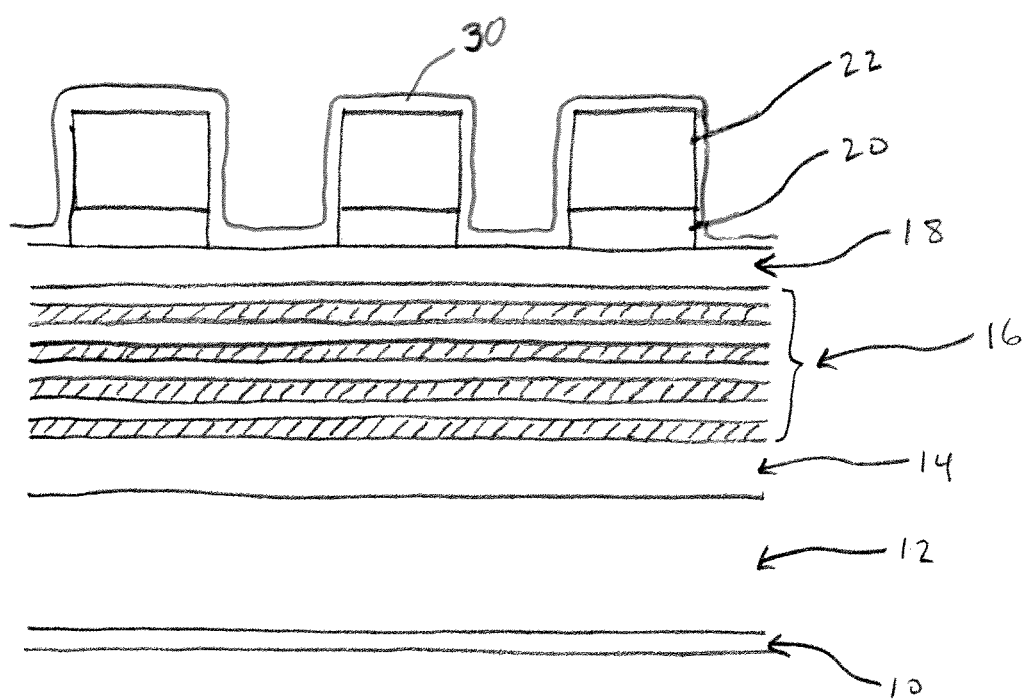
FIG. 2 illustrates a EUV lithography mask stacking structure with a protective capping layer, in accordance with an embodiment of the invention.

With reference to FIG. 2, an EUV lithography mask stacking structure with the protective capping layer is shown, in accordance with an embodiment of the invention. A conductive coating 10 is provided for enabling electrostatic adherence to a chuck on which the EUV lithography mask is mounted. The conductive coating is typically composed of a hard conductive material such as chromium nitride (CrN). A low thermal expansion material (LTEM) layer 12 provides structural support for the EUV lithography mask. The LTEM layer 12 is typically composed of a type of glass so as to provide a durable physical support structure with low thermal expansion. An underlayer 14 provides a transition layer between the LTEM layer 12 and a reflective multilayer 16.

The reflective multilayer 16 is the functionally reflective portion of the mask, and may include of 40 or more pairs of alternating molybdenum (Mo) and silicon (Si) layers. However, this exemplary number of pairs is not meant to be limiting as more or less pairs that achieve the desired reflectance can be utilized. The Mo layers reflect EUV radiation, whereas the Si layers allow transmission of the EUV radiation. Thus, the alternating Mo and Si layers collectively form a Bragg reflector to reflect EUV radiation. It should be appreciated that other material may be incorporated into the material stack as long as the functionality provided by the multilayer stack, i.e., the Bragg minor functionality, is maintained. A capping layer 18 is deposited over the reflective multilayer, and may include of ruthenium (Ru) or platinum (Pt). A buffer layer 20 forms a transitional layer between the capping layer 18 and an absorber layer 22. The absorber layer 22 absorbs EUV radiation and is typically composed of a combination of tantalum (Ta), nitrogen (N), boron (B), oxygen (O), and platinum (Pt). Exemplary compounds which may be utilized for the absorber layer 22 include TaBO, TaBN, TaNO, TaN or Pt. Protective capping layer 30 is deposited over the exposed surfaces of the absorber layer 22, the buffer layer 20, and the capping layer 18. It should be appreciated that the capping layer 18 is distinct from the protective capping layer 30 in its position in the full stack.

The upper surfaces of the EUV lithography mask, including the absorber layer 22, as well as portions of the capping layer 18 and buffer layer 20, are exposed to ambient conditions inside of the processing chamber in which the EUV lithography mask is installed without protective capping layer 30. Therefore, these surfaces are susceptible to contamination during operation without protective capping layer 30. Though, EUV lithography process chambers are generally operated under vacuum conditions to prevent unwanted absorption of EUV radiation by ambient particles, there still remains a small but significant amount of particulates and contaminates which can settle on the EUV lithography mask's exposed surfaces. Additionally, the exposed surfaces of the EUV lithography mask are subject to chemicals which are utilized or otherwise generated in the processing chamber. These chemicals may also settle on or even attack the exposed portions of the EUV lithography mask. The buildup of such particles, contaminates, and chemicals on the EUV lithography mask leads to increasing amounts of defects on the exposed photoresist of a wafer or substrate, ultimately causing a reduction in yield from the finished product.

It should be appreciated that without the uniform protective capping layer 30 for the EUV lithography mask, the exposed surfaces of an EUV lithography mask typically include multiple types of materials from both the capping layer and the absorber layer, selectivity issues limit the choice of chemicals and processes available for performing cleaning. Chosen materials and methods of cleaning must be compatible with both the capping layer and absorber layer. Moreover, cleaning methods for EUV lithography masks must avoid causing damage to the physical structure of the exposed surfaces of the EVU lithography mask. A single homogenous layer therefore provides a user with less variables to be concerned with as opposed to dealing with multiple exposed layers. Exemplary cleaning chemistries and techniques include sulfuric acid and hydrogen peroxide mixture (SPM), hydrogen chloride and hydrogen peroxide mixture, Ammonium hydroxide and hydrogen peroxide mixture, ozonated water, ozonated hydrogen peroxide, oxygen plasma, ultraviolet/ozone treatment and laser-induced plasma shock waves.

Figure 3:
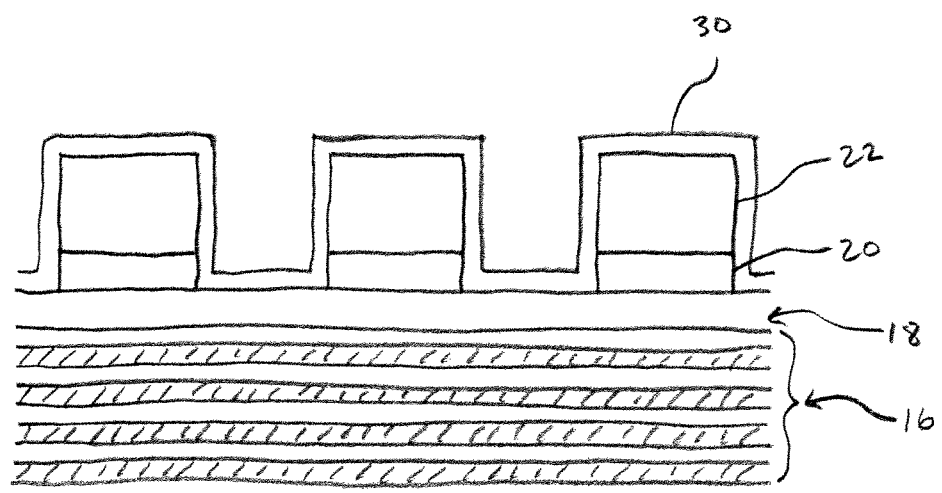
FIG. 3 illustrates the top portion of an EUV lithography mask having a protective capping layer, in accordance with an embodiment of the invention.

FIG. 3 illustrates a more detailed view of the EUV lithography mask having a protective capping layer, in accordance with an embodiment of the invention. The protective capping layer may also have barrier and passivating properties. As shown, the protective capping layer 30 is deposited over the exposed surfaces of the absorber layer, the buffer layer 20, and the capping layer 18. The protective capping layer 30 is a thin film which is substantially optically transparent to EUV radiation, so as to enable transmission of the EUV radiation to the underlying absorber layer 22 and reflective multilayer 16. In one embodiment, the protective capping layer 30 is specifically configured to be substantially transparent to EUV radiation having a wavelength of approximately 10-20 nanometers.

Additionally, the protective capping layer 30 is a thin film (so as to facilitate transparency) having a thickness of less than about 2 nanometers. In another embodiment, the thickness of protective capping layer 30 is about 1 nanometer. The protective capping layer 30 is conformal to underlying features of the EUV lithography mask, so as not to significantly affect or change the patterning of the EUV lithography mask which determines the pattern of EUV radiation reflected onto the photoresist of a substrate. The protective capping layer 30 is in one embodiment, a closed film so as to form one continuous and homogeneous layer over the EUV lithography mask. Thus, once deposited, the protective capping layer 30 is the layer of the EUV lithography mask exposed to ambient conditions, thereby protecting underlying layers from exposure.

Furthermore, the protective capping layer 30 is in one embodiment, chemically inert with regards to the typical cleaning process to be used, so as not to react with chemical species to which the protective capping layer 30 will be exposed. Also, the protective capping layer 30 should have acceptable adhesion to the underlying layers of the EUV lithography mask, and have appropriate thermal expansion properties within the intended range of use temperatures (e.g. up to 100 degrees Celsius or above for certain kinds of cleaning processes or elevated temperatures during normal use through heating by EUV irradiation) so as to maintain good adhesion to the underlying layers. The protective capping layer 30 may be tailored to be resistant to specific cleaning chemicals and methods. The protective capping layer 30 may also provide increased durability so as to enable more aggressive cleaning of the EUV lithography mask without risk of damaging the mask. Moreover, the specific composition of the protective capping layer 30 may enable the consideration and use of other types of cleaning chemistries and methods not heretofore utilized for cleaning EUV lithography masks due to prior limitations. Because only the singular material of the protective capping layer is exposed (as opposed to the multiple materials which are exposed in the absence of a protective capping layer), selectivity issues are avoided, and cleaning chemistries and methodologies may be developed based on a simpler construct. Examples of compositions which may be used to form a protective capping layer not meant to be limiting, as described above, include the following: $SiO_2$, SiN, SiC, SiB, $GeO_2$, TiO2, $HfO_2$, $ZrO_2$, $Al_2O_3$, mixtures thereof.

The protective capping layer may be deposited according to various methods of deposition, including dry processes such as atomic layer deposition (ALD), chemical vapor deposition (CVD), physical vapor deposition (PVD) or plasma enhanced deposition processes. Wet deposition processes may also be use to deposite the protective capping layer, such as electroless deposition or electroplating deposition. Atomic layer deposition enables deposition of self-limiting atomic-scale single layers, and may be particularly suited for deposition of a protective capping layer as herein described, especially for a layer thickness of less than two nanometers.

The protective capping layer provides improved resistance to cleaning, and enables alternative and more aggressive cleaning methods to be utilized. However, repeated use of the mask may cause wear of the protective capping layer to occur. Thus, in accordance with some embodiments of the invention, the protective capping layer may be replenished by redepositing the protective capping layer on the surface of the EUV lithography mask once wear becomes an issue in the performance of the EUV lithography mask. Prior to redepositing the protective barrier layer onto the EUV lithography mask, the mask must be cleaned so as to ensure that foreign matter is not encapsulated by the redeposited protective capping layer. In one embodiment, the EUV lithography mask is cleaned, and redeposition is utilized to replenish gaps in the coverage of the protective capping layer. In another embodiment, the existing protective capping layer is chemically stripped, and an entirely new protective capping layer is then deposited onto the EUV lithography mask, e.g. through an ALD process. By replenishing the protective capping layer, the useful lifespan of the EUV lithography mask may be extended. Furthermore, replenishing the protective capping layer can be much less costly than replacing the EUV lithography mask.

Figure 4:
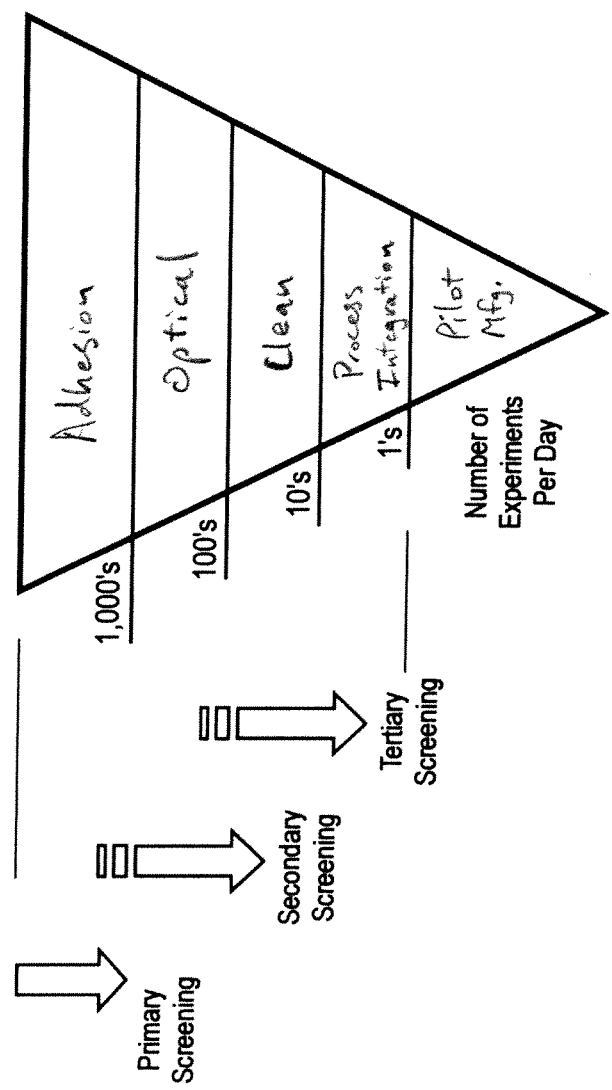
FIG. 4 is a simplified schematic diagram illustrating an overview of a High-Productivity Combinatorial (HPC) screening process for use in evaluating materials, unit processes, and process sequences for the manufacturing and use of a protective capping layer on an EUV lithography mask, in accordance with one embodiment of the invention.

FIG. 4 is a simplified schematic diagram illustrating an overview of the High-Productivity Combinatorial (HPC) screening process for use in evaluating materials, unit processes, and process sequences for the development and manufacturing of semiconductor devices in accordance with one embodiment of the invention. As illustrated in FIG. 4, primary screening incorporates and focuses on materials discovery. Here, the materials may be screened for certain properties in order to select possible candidates for a next level of screening. In the initial primary screening there may be thousands of candidates which are subsequently reduced to hundreds of candidates. These hundreds of candidates can then be used or advanced to secondary screening processes which will look at materials and unit processes development. In the secondary screening level, process integration may be additionally considered to narrow the candidates from hundreds of candidates to tens of candidates. Thereafter, tertiary screening further narrows these candidates through process integration and device qualification in order to identify some best possible optimizations in terms of materials, unit processes and process sequence integration.

In one embodiment, the primary and secondary testing may occur on a coupon, while the tertiary testing is performed on a production size mask/substrate. Through this multi-level screening process, the best possible candidates have been identified from many thousands of options. The time required to perform this type of screening will vary, however, the efficiencies gained through the HPC methods provide a much faster development system than any conventional technique or scheme. While these stages are defined as primary second and tertiary, these are arbitrary labels placed on these steps. Furthermore, primary screening is not necessarily limited to materials research and can be focused on unit processes or process sequences, but generally involves a simpler substrate, less steps and quicker testing than the later screening levels.

The protective layer of the EUVL may be optimized using a combinatorial methodology. With regard to the EUV lithography mask described herein, the primary testing may involve experimentation on a coupon or substrate with multiple layers being disposed over the coupon or substrate and with the protective capping layer deposited as the outermost layer of the EUV lithography mask. The resulting substrate and stack may then be repeatedly heated up and checked for adhesion properties and exposed to various cleaning chemistries for film integrity. Thereafter, secondary screening may take the most promising candidates from the primary screening and perform further experiments. In one embodiment the experiments for the secondary screening may include depositing protective capping materials selected from the primary screening onto a coupon or substrate and evaluating that material for optical properties, e.g., transparency to EUV radiation. From the selected candidates of the secondary screening a tertiary screening can be performed where the EUV mask is manufactured and utilized to define a resist pattern, which is then developed and evaluated. The mask can be used multiple times and cleaned multiple times to provide data on the robustness and longevity of the mask.

The stages also may overlap and there may be feedback from the secondary to the primary, and the tertiary to the secondary and/or the primary to further optimize the selection of materials, unit processes and process sequences. In this manner, the secondary screening begins while primary screening is still being completed, and/or while additional primary screening candidates are generated, and tertiary screening can begin once a reasonable set of options are identified from the secondary screening. Thus, the screening operations can be pipelined in one embodiment. As a general matter and as discussed elsewhere in more detail, the level of sophistication of the structures, process sequences, and testing increases with each level of screening. Furthermore, once the set of materials, unit processes and process sequences are identified through tertiary screening, they must be integrated into the overall manufacturing process and qualified for production, which can be viewed as quaternary screening or production qualification. In one more level of abstraction, a wafer can be pulled from the production process, combinatorially processed, and returned to the production process under tertiary and/or quaternary screening.

In the various screening levels, the process tools may be the same or may be different. For example, in dry processing the primary screening tool may be a combinatorial sputtering tool available described, for example, in U.S. Pat. No. 5,985,356. This tool is efficient at preparing multi-material samples in regions for simple materials properties analysis. For secondary and/or tertiary screening technique, a modified cluster tool may be retrofitted with a combinatorial chamber. As another example, in wet processing, the primary and secondary screening can be implemented in the combinatorial tool. The main differences here are not the capabilities of the tools, but the substrates used, the process variations or structures created and the testing done. For the tertiary tool, a wet reactor with combinatorial and non-combinatorial chambers described in U.S. application Ser. No. 11/647,881 filed Dec. 29, 2006, could be used for integrated and more sophisticated processing and analysis.

In the development or screening cycle, typically there are many materials synthesized or processed involving large permutations of a plurality of materials, a plurality of processes, a plurality of processing conditions, a plurality of material application sequences, a plurality of process integration sequences, and combinations thereof. Testing of these many materials may use a simple test, such as adhesion, optical properties or resistivity and may involve a blanket substrate (or coupon) or one with basic test structures to enable testing for one or more desired properties of each material or unit process. Once the successful materials or unit processes have been selected, combinatorial techniques are applied to analyze these materials or processes within a larger picture. That is, the combinatorial techniques determine whether the selected materials or unit processes meet more stringent requirements during second stage testing. The processing and testing during the second stage may be more complex, e.g., using a patterned substrates or coupon, with more test structures, larger regions, more variations, more sophisticated testing, etc. For example, the structure defined by the material and unit process sequence can be tested for properties related or derived from the structure to be integrated into the commercial product.

This iterative process may continue with larger and more complex test circuits being used for testing different parameters. This approach serves to increase the productivity of the combinatorial screening process by maximizing the effective use of the substrate real estate, and optimizing the corresponding reactor and test circuit design with the level of sophistication required to answer the level of questions necessary per stage of screening. Complex reactors and/or test circuit designs are utilized at later stages of screening when desired properties of the materials, processing conditions, process sequence, etc. are substantially known and/or have been refined via prior stages of screening.

The subsections of test structures generated from previous testing for some screening levels may be incorporated into subsequent, more complex screening levels in order to further evaluate the effectiveness of process sequence integrations and to provide a check and correlation vehicle to the previous screen. It should be appreciated that this ability allows a developer to see how results of the subsequent process differed from the results of the previous process, i.e., take into account process interactions. In one example, materials compatibility may be used as a primary test vehicle in primary screening, then specific structures incorporating those materials (carried forward from the primary screen) are used for the secondary screening. As mentioned herein, the results of the secondary screening may be fed back into the primary screening also. Then, the number and variety of test structures is increased in tertiary screening along with the types of testing, for example, electrical testing may be added or device characterization may be tested to determine whether certain critical parameters are met. Of course, electrical testing is not reserved for tertiary testing as electrical testing may be performed at other screening stages. The critical parameters generally focus on the requirements necessary to integrate the structures created from the materials and process sequence into the commercial product, e.g., an EUV lithography mask.

Embodiments of the present invention provide greatly improved methods for the production of an EUV lithography mask having a protective capping layer. It is to be understood that the above description is intended to be illustrative and not restrictive. Many embodiments and variations of the invention will become apparent to those of skill in the art upon review of this disclosure. Merely by way of example a wide variety of process times, process temperatures and other process conditions may be utilized, as well as a different ordering of certain processing steps. The scope of the invention should, therefore, be determined not with reference to the above description, but instead should be determined with reference to the appended claims along with the full scope of equivalents to which such claims are entitled.

The explanations and illustrations presented herein are intended to acquaint others skilled in the art with the invention, its principles, and its practical application. Those skilled in the art may adapt and apply the invention in its numerous forms, as may be best suited to the requirements of a particular use. Accordingly, the specific embodiments of the present invention as set forth are not intended as being exhaustive or limiting of the invention.

The embodiments described above provide methods and apparatus for the parallel or rapid serial synthesis, processing and analysis of novel materials having useful properties identified for semiconductor manufacturing processes. Any materials found to possess useful properties can then subsequently be prepared on a larger scale and evaluated in actual processing conditions. These materials can be evaluated along with reaction or processing parameters through the methods described above. In turn, the feedback from the varying of the parameters provides for process optimization. Some reaction parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, etc. In addition, the methods described above enable the processing and testing of more than one material, more than one processing condition, more than one sequence of processing conditions, more than one process sequence integration flow, and combinations thereof, on a single substrate without the need of consuming multiple substrates per material, processing condition, sequence of operations and processes or any of the combinations thereof. This greatly improves the speed as well as reduces the costs associated with the discovery and optimization of semiconductor manufacturing operations.

Moreover, the embodiments described herein are directed towards delivering precise amounts of material under precise processing conditions at specific locations of a substrate in order to simulate conventional manufacturing processing operations. As mentioned above, within a region the process conditions are substantially uniform, in contrast to gradient processing techniques which rely on the inherent non-uniformity of the material deposition. That is, the embodiments, described herein locally perform the processing in a conventional manner, e.g., substantially consistent and substantially uniform, while globally over the substrate, the materials, processes and process sequences may vary. It should be noted that the discrete steps of uniform processing is enabled through the HPC systems described herein.

Any of the operations described herein that form part of the invention are useful machine operations. The invention also relates to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

The invention claimed is:

1. An extreme ultraviolet (EUV) lithography mask comprising:
   a reflective layer;
   an absorptive layer deposited over the reflective layer,
      the absorptive layer being patterned so as to define absorptive regions of the mask for absorbing EUV radiation and reflective regions of the mask for reflecting EUV radiation; and
   a protective capping layer being conformally deposited over both the absorptive regions and the reflective regions of the EUV lithography mask,
      the protective capping layer comprising one of SiC, SiB, $GeO_2$, $TiO_2$, or mixtures thereof.

2. The EUV lithography mask of claim 1, wherein the protective capping layer has a thickness of less than about one nanometer.

3. The EUV lithography mask of claim 1, wherein the protective capping layer is substantially transparent to radiation having a wavelength of about 10 to 20 nanometers.

4. The EUV lithography mask of claim 1, wherein the protective capping layer is deposited by an atomic layer deposition process.

5. The EUV lithography mask of claim 1, wherein the protective capping layer has a thickness of about one nanometer.

6. An EUV lithography mask, comprising:
   a top portion having absorptive regions for absorbing EUV radiation and reflective regions for reflecting EUV radiation;
   a transparent passivation layer deposited over said top portion,
      the transparent passivation layer protecting the absorptive regions and the reflective regions of the top portion,
      the transparent passivation layer comprising one of SiC, SiB, $GeO_2$, $TiO_2$, or mixtures thereof; and
   a bottom portion including a reflective layer for reflecting EUV radiation.

7. The EUV lithography mask of claim 6, wherein the transparent passivation layer has a thickness of less than about one nanometer.

8. The EUV lithography mask of claim 6, wherein the reflective layer of the bottom portion is defined by a Bragg reflector.

9. The EUV lithography mask of claim 6, wherein the transparent passivation layer is substantially transparent to radiation having a wavelength of about 10 to 20 nanometers.

10. The EUV lithography mask of claim 6, wherein the transparent passivation layer is deposited by an atomic layer deposition process.

11. The EUV lithography mask of claim 6, wherein the transparent passivation layer is deposited over at least two different layer surfaces of the top portion.

12. The EUV lithography mask of claim 11, wherein the different layer surfaces are selected from the group consisting of an absorber layer, a buffer layer, and a capping layer.

13. The EUV lithography mask of claim 6, wherein the transparent passivation layer has a thickness of about one nanometer.

14. A method for evaluating materials, unit processes, and process sequences for manufacturing an EUV lithography mask, comprising:
  processing a first substrate having a first layer of material deposited over a second layer of material, the first and second layers representing a top portion of the EUV lithography mask, the first layer comprising one of $SiC$, $SiB$, $GeO_2$, $TiO_2$, or mixtures thereof;
  testing the first substrate for adherence properties between the layers;
  processing regions on a second substrate in a combinatorial manner by varying one of materials, unit processes or process sequences based on results from the testing of the first substrate, the regions on the second substrate representing a barrier layer deposited over the top portion of the EUV lithography mask; and
  testing the processed regions on the second substrate for optical properties.

15. The method of claim 14, wherein the material for the first layer of the first substrate comprises a protective barrier layer material.

16. The method of claim 14, wherein the material for the second layer of the first substrate is selected from the group consisting of an absorber layer material, a buffer layer material, and a capping layer material.

17. The method of claim 14, wherein the top portion of the EUV lithography mask includes materials selected from the group consisting of an absorber layer material, a buffer layer material, and a capping layer material.

18. The method of claim 14, further comprising:
  processing a third substrate utilizing the EUV lithography mask, wherein the EUV lithography mask is manufactured based on results from the testing of the first and the second substrates.

* * * * *